United States Patent
Jou et al.

(10) Patent No.: US 9,367,661 B2
(45) Date of Patent: Jun. 14, 2016

(54) APPARATUS AND METHOD FOR E-BEAM WRITING

(71) Applicant: TAIWAN SEMICONDUCTOR MANUFACTURING CO., LTD., Hsinchu (TW)

(72) Inventors: Jia-Guei Jou, New Taipei (TW);
Yi-Chiuan Luo, Taichung (TW);
Chih-Chung Huang, Hsinchu (TW);
Chi-Ming Tsai, Taipei (TW);
Chih-Chiang Tu, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/477,285

(22) Filed: Sep. 4, 2014

(65) Prior Publication Data

US 2016/0070843 A1 Mar. 10, 2016

(51) Int. Cl.
*G06F 17/50* (2006.01)

(52) U.S. Cl.
CPC .................. *G06F 17/5081* (2013.01)

(58) Field of Classification Search
CPC ........ G03F 1/144; G03F 1/36; G06F 17/5081
USPC ............................................. 716/53
See application file for complete search history.

(56) References Cited

U.S. PATENT DOCUMENTS 7,159,197 B2 * 1/2007 Falbo et al. ................ 716/52
2013/0268901 A1 * 10/2013 Lu et al. ..................... 716/52

* cited by examiner

*Primary Examiner* — Vuthe Siek
(74) *Attorney, Agent, or Firm* — McDermott Will & Emery LLP

(57) ABSTRACT

A method of preparing mask data, the method begins with performing a logic operation to a design layout, and an optical proximity correction (OPC) is performed to the design layout to form an OPC feature. The OPC feature has a first jog and a second jog on a line, and the first jog is larger than the second jog in width. The OPC feature is resized to form a resized first jog and a resized second jog on the line if a width ratio of the first jog to the second jog being smaller than a predetermined value.

20 Claims, 6 Drawing Sheets

APPARATUS AND METHOD FOR E-BEAM WRITING

BACKGROUND

The semiconductor integrated circuit industry has experienced exponential growth. In semiconductor manufacturing, functional density is generally increasing with reduced geometry size, and smaller and more complex integrated circuits than the previous generation are produced. This scaling down process also increases the processing and manufacturing complexity of integrated circuits. For these advances to be realized, associated developments are required in the processing and manufacturing of the integrated circuits.

Usually, an integrated circuit (IC) design is formed on a wafer using various fabrication processes, such as etching, deposition, implantation, annealing, polishing and lithography. The lithography process transfers a feature from a mask to the wafer. The mask includes an IC feature and being repeatedly used in wafer fabrication, and an electron beam (e-beam) writing process is applied to fabricate the mask. As the integrated circuits are continually progressing to smaller feature sizes, e.g. 28 nanometers, 20 nanometers, or below, is the lithography processes face even more challenges to form the mask.

Various lithography processes have been approached for higher resolution such that a small feature may be precisely printed on wafers. For example, an optical proximity correction (OPC) technique is implemented in a mask fabrication. The OPC process employs a lithographic model to predict contours of the features after the lithography process. Cycle time of e-beam forming the mask is prolonged and the corresponding mask making cost is higher. Therefore, there are constant needs for a method and an apparatus for saving the mask fabricating cycle time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
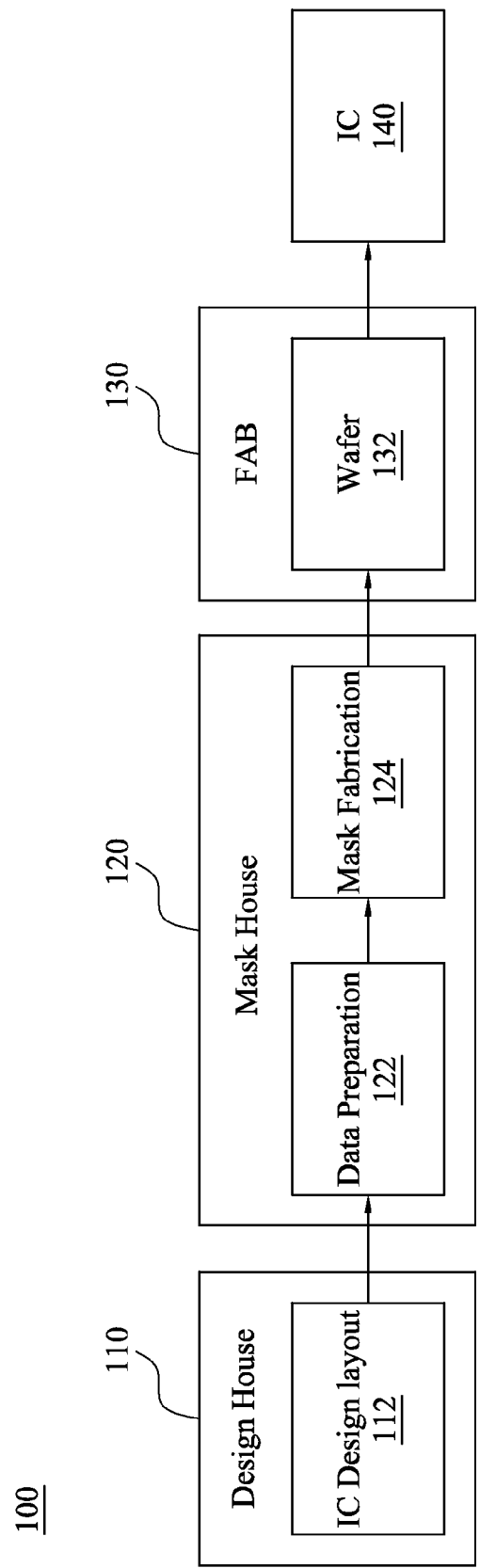
FIG. 1 is a simplified block diagram of an integrated circuit manufacturing system, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified block diagram of an integrated circuit (IC) manufacturing system according to various embodiments of the present disclosure. An IC manufacturing system 100 includes a design house 110, a mask house 120 and an IC fabrication entity (FAB) 130.

The design house 110 generates an IC design layout 112, which the IC design layout 112 includes various geometrical features designed for an IC product, based on a specification of the IC product to be manufactured. The design house 110 implements a proper design procedure to form the IC design layout 112, which the design procedure may include logic design, physical design and schematic design.

Then, the design house 110 provides the IC design layout 112 to the mask house 120. The mask house 120 performs a data preparation process 122 and a mask fabrication process 124 to fabricate a mask according to the IC design layout 112. First, the mask house 120 performs the data preparation process 122, and the IC design layout 112 is translated into a form, which could be physically written by a mask writer. The IC design layout 112 is modified by the data preparation process 122 to comply with a particular mask writer and/or mask manufacturer. After the data preparation process 122, a mask or a set of masks are fabricated by the mask fabrication process 124. For example, an energy beam, e.g., an electron beam (e-beam), or a mechanism of multiple energy beams is used as an exposure source to form a patterned mask.

In embodiments, the data preparation process 122 and the mask fabrication process 124 are illustrated as separated process. In some embodiments, the data preparation process 122 and mask fabrication process 124 could be collectively referred as the data preparation process 122.

The IC fabrication entity (FAB) 130 is a semiconductor manufacturer for manufacturing a wafer 132, which is manufactured by using a mask or a set of masks formed in the mask house 120.

In embodiments, the wafer 132 includes a silicon substrate or other proper substrate and material layers formed thereon. Other proper substrate may alternatively be made of some suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer 132 may further include various doped regions, dielectric features, and multilevel interconnects.

The IC fabrication entity 130 includes various fabrication tools to apply various fabrication processes to the wafer 132 for fabricating an IC product 140. The fabrication processes include, deposition, etching, polishing, cleaning, annealing and lithography. Especially, the IC fabrication entity 130 uses a lithography process to form an IC feature on the wafer 132. The IC feature is first transferred from the mask to a sensitive material layer, e.g., photoresist. An exemplary lithography process may include processing steps of photoresist spin-on coating, soft baking, mask aligning, exposing, post-exposure baking, developing photoresist and hard baking.

Figure 2:
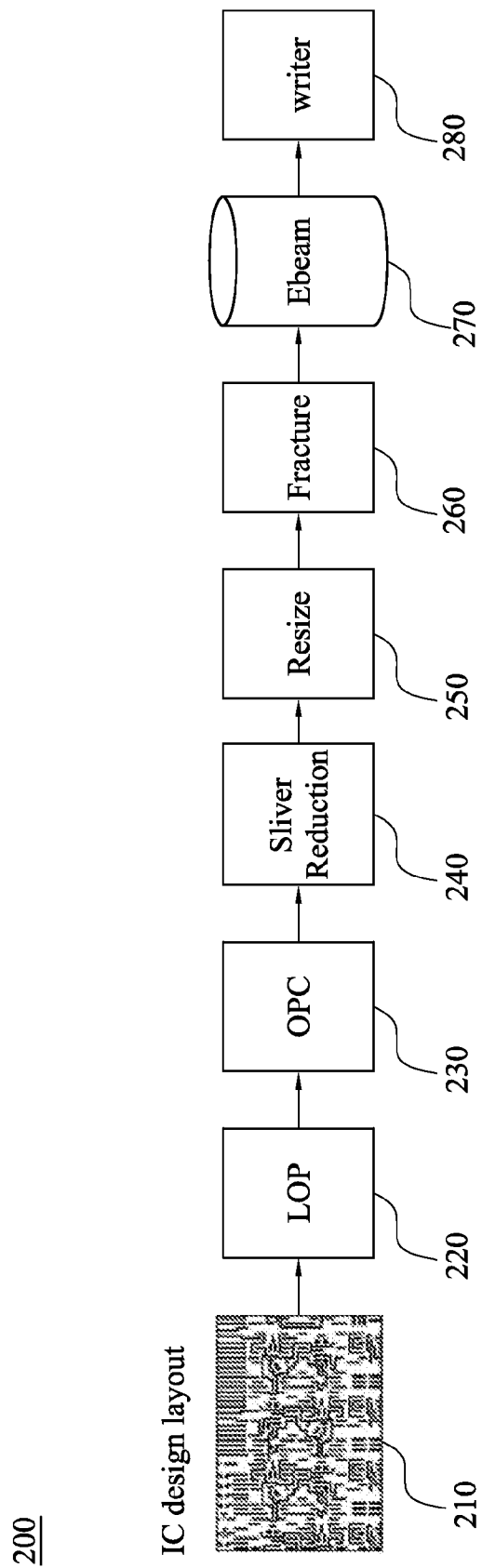
FIG. 2 is a flow chart of a method for manufacturing the mask, in accordance with various embodiments.

Please referring to FIG. 2 to further clarify the data preparation process 122 and the mask fabrication process 124 processed in the mask house 120. FIG. 2 is a flow chart of a method for manufacturing the mask in accordance with various embodiments. A method 200 begins with operation 210; the design house 110 provides the IC design layout 112 to the mask house 120. The IC design layout 112 includes various geometrical features designed for an IC product 140 and based on the application of an IC product 140.

In embodiments, the IC design layout 112 is provided by a design team separated from a semiconductor manufacturer assigned for making IC products 140 according to the IC design layout 112. In various embodiments, the semiconductor manufacturer is capable for making masks, wafers, or both.

In embodiments, the IC design layout 112 includes various IC features, such as active region, gate electrode, and source/drain are formed in a semiconductor substrate. Further, metal lines, vias for the interlayer interconnection, openings for bonding pads, and various material layers are disposed on the semiconductor substrate. The IC design layout 112 may include certain assist features, such as those features for imaging effect, processing enhancement, and/or mask identification information.

Continuing to operation 220, a logic operation (LOP) process is performed to the IC design layout 112. The LOP process modifies the IC design layout 112 according to the manufacturing rules. Various manufacturer modules convert the manufacturing constrains into a set of rules that the IC design layout 112 has to meet. Otherwise, the IC design layout 112 will be modified accordingly such that the modified IC design layout meets these rules.

Referring to operation 230, an optical proximate correction (OPC) process is performed to the IC design layout 112 using a model-based approach. During the OPC process, the IC design layout 112 is modified such that the modified IC design layout has an improved image on the wafer 132. In general, the OPC process is utilized to modify the shape of the IC design layout 112 to compensate for diffraction or other process effects, and the shape of the feature formed on the wafer 132 closely matches the shape of the feature in the IC design layout 112. The modification of the IC design layout 112 at this operation includes resizing IC design layout 112, repositioning an edge of the IC design layout 112 and reshaping the IC design layout 112. In embodiments, the OPC process also adds various assist features, such as scattering bars, serifs or hammerheads to modify the IC design layout 112.

Figure 3:
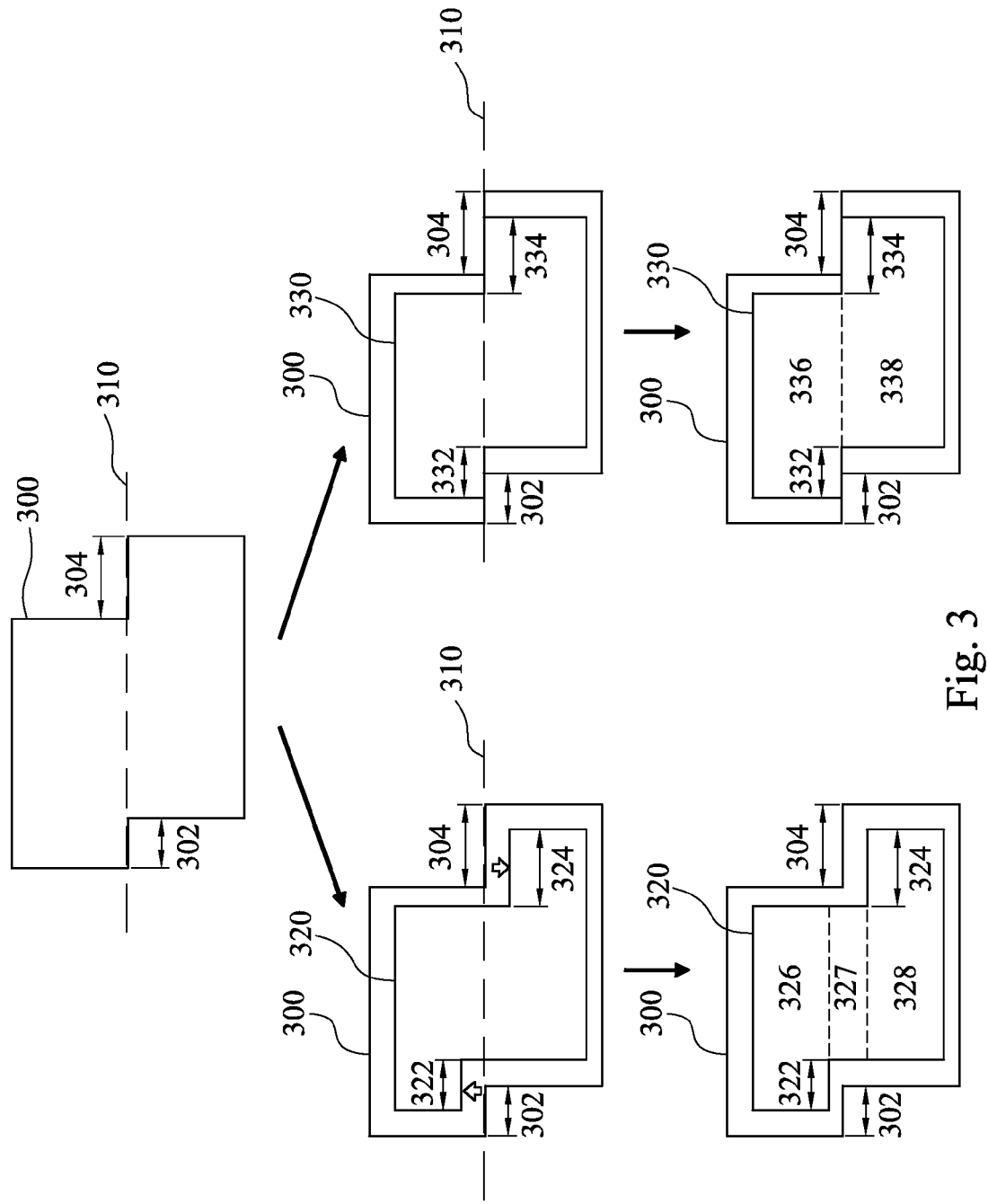
FIG. 3 is a schematic view at various stages of data preparation process, in accordance with various embodiments.

Please referring to FIG. 3 to further clarify the present disclosure. FIG. 3 is a schematic view at various stages of data preparation process 122. After the LOP process, the OPC process modifies the IC design layout 112 and forms an OPC feature 300. The OPC process changes the shape and the size of the IC design layout 112, and a plurality of jogs are formed. One jog is related to a fragmented edge, and one straight edge is fragmented into two or more straight segments with shifting between adjacent straight segments. More specifically, each jog is vertical to two parallel segments and connecting the two parallel segments. The OPC feature 300 has a first jog 302 and a second jog 304, which the first jog 302 and the second jog 304 are on a line 310, and the first jog 302 is larger than the second jog 304 in width.

Conventionally, it is necessary to resize the OPC feature 300 because the dimension of the OPC feature 300 is changed when transferring the OPC feature 300 to the mask. For example, developing process, etching process, stripping process and chemical mechanical polishing (CMP) process would change the dimension of the OPC feature 300. Therefore, a resizing process is necessary to be applied on the OPC feature 300 so that the patterned mask has the same dimension with the OPC feature 300.

Please referring to operation 250, the OPC feature 300 is resized to form a resized OPC feature 320. FIG. 3 illustrates the resized OPC feature 320 by resizing the dimension of the OPC feature 300. In this case, dimension of the resized OPC feature 320 is reduced by the resizing process. In embodiments, dimension of the resized OPC feature 320 could be expanded depending upon a feature density. It is worth noting that the first jog 302 moves upward to form a resized first jog 322, and the second jog 304 moves downward to form a resized second jog 324. Thus, the resized first jog 322 and the resized second jog 324 are no longer on the line 310.

Because asymmetrical jogs will take more e-beam write time and increase cycle time, and further increase the mask fabrication cost. It is much clearer when the method 200 proceeds to operation 260 by fracturing the resized OPC feature 320 into multiple polygons for e-beam writing. In this case, the resized OPC feature 320 is fractured along the resized first jog 322 and the resized second jog 324, and two main polygons 326 and 328 and a sliver polygon 327 between the two main polygons 326 and 328 are formed. Since the sliver polygon 327 is much smaller than the main polygons 326 and 328, it is not friendly for e-beam writing. Also, the sliver polygon 327 increases difficulty of controlling mask critical dimension (CD). Accordingly, the e-beam writing time will be increased significantly. In some embodiments, the polygons are individually rectangles or squares.

According to the present disclosure, the method further includes operation 240 to perform a sliver reduction process on the OPC pattern 300, and the number of the polygons could be reduced. The sliver reduction process is implemented after the OPC process and before the resizing process, which the sliver reduction process is applied to determine how to resize the OPC pattern 300 when these adjustments have no or limited impact to the contour or the imaging of the IC design layout 112 on the wafer 132.

Please referring to FIG. 3, after the sliver reduction process, the OPC feature 300 is resized to form a resized feature 330, which a resized first jog 332 and a resized second jog 334 are on the line 310 if a width ratio of the first jog 302 to the second jog 304 being smaller than a predetermined value. As aforementioned, the OPC feature 300 has the first jog 302 and the second jog 304 on the line 310, and the first jog 302 is larger than the second jog 304 in width. It should be noticed that a size and a position of the first jog 302 are varied along the line 310 to form the resized first jog 332, and a size and a position of the second jog 304 are also varied along the line 310 to form the resized second jog 334. Since the resized first jog 332 and the resized second jog 334 are still on the line 310, the resized feature 330 could be fractured along the line 310 to form a first main polygon 336 and a second main polygon 338. With applying the sliver reduction process, the resizing process will not form the sliver polygon between the main polygons 336 and 338. Thus, the e-beam writing time is decreased, and the critical dimension of the mask could be improved significantly.

In embodiments, the predetermined value is in a range from about 3 to about 6. In some embodiments, the predetermined value is in a range from about 4 to about 5.

Referring to operation 270, the first main polygon 336 and the second main polygon 338 are modified to a format accessible by a mask fabrication apparatus, such as an energy beam writer. In embodiments, the energy beam writer is an e-beam writer. The fracturing process is implemented after the resizing process and generates a set of e-beam data in a format accessible by the e-beam writer. The set of e-beam data may be referred to as tape-out for mask fabricating.

Continuing to operation 280, an e-beam writing process is performed to apply the two main polygons 336 and 338 for forming a mask. During the e-beam writing process, a mask is coated with a resist layer, and one or more e-beams may be generated and directed to the resist layer. In embodiments, the resist layer is an energy sensitive resist layer, such as electron-sensitive resist layer, to the energy beam source like the e-beam source. The features of first main polygon 336 and the second main polygon 338 are written on the electron-sensitive resist layer by a proper strategy, such as a raster mode. Further, the electron-sensitive resist layer is developed to form a patterned electron-sensitive resist layer, and the mask is etched through the patterned electron-sensitive resist layer. In embodiments, the e-beam may be directly used to etch the material layer on the mask blank according the e-beam data.

Although the sliver reduction process significantly improves efficiency of the e-beam writer, it should be noticed that some sliver polygons should be maintained because they represent characteristics of the IC products 140. Thus, a mechanism is necessary to decide which polygon could be reduced.

Figure 4:
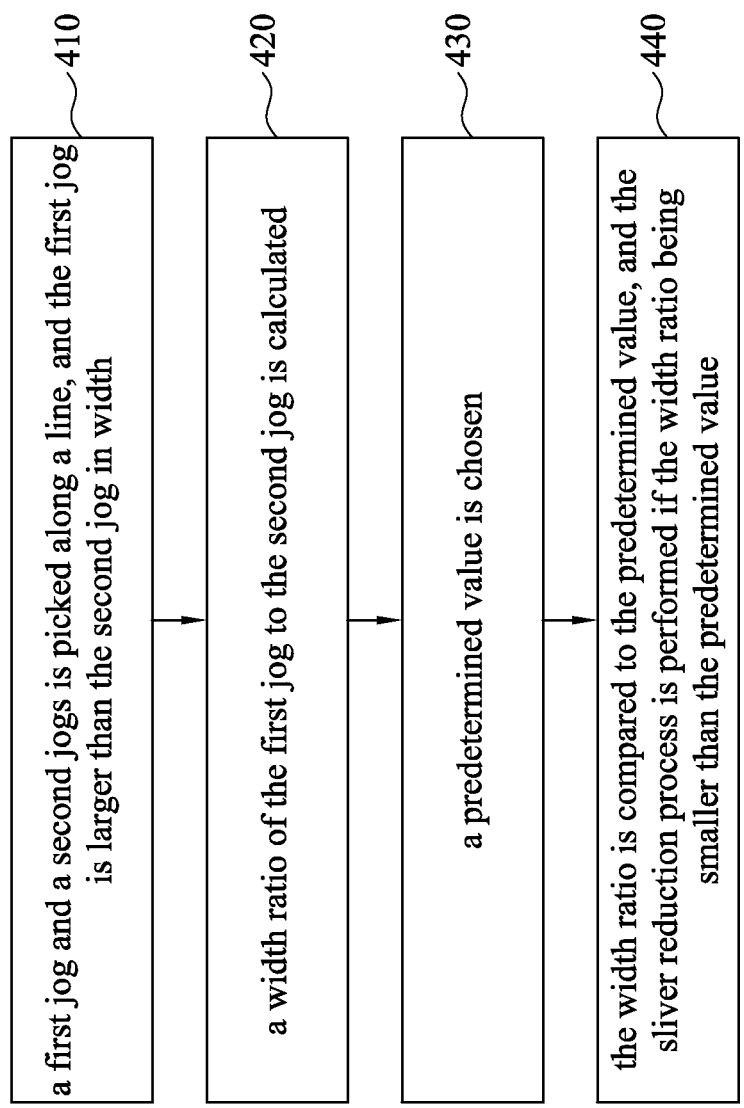
FIG. 4 is a flowchart of a mechanism for reducing the sliver polygon, in accordance with various embodiments.

FIG. 4 is a flowchart of a mechanism for reducing the sliver polygon according to various embodiments of the present disclosure. Please referring to operation 410, a first jog and a second jog is picked along a line, and the first jog is larger than the second jog in width. Please referring to FIG. 5 to further clarify the mechanism shown in FIG. 4.

Figure 5:
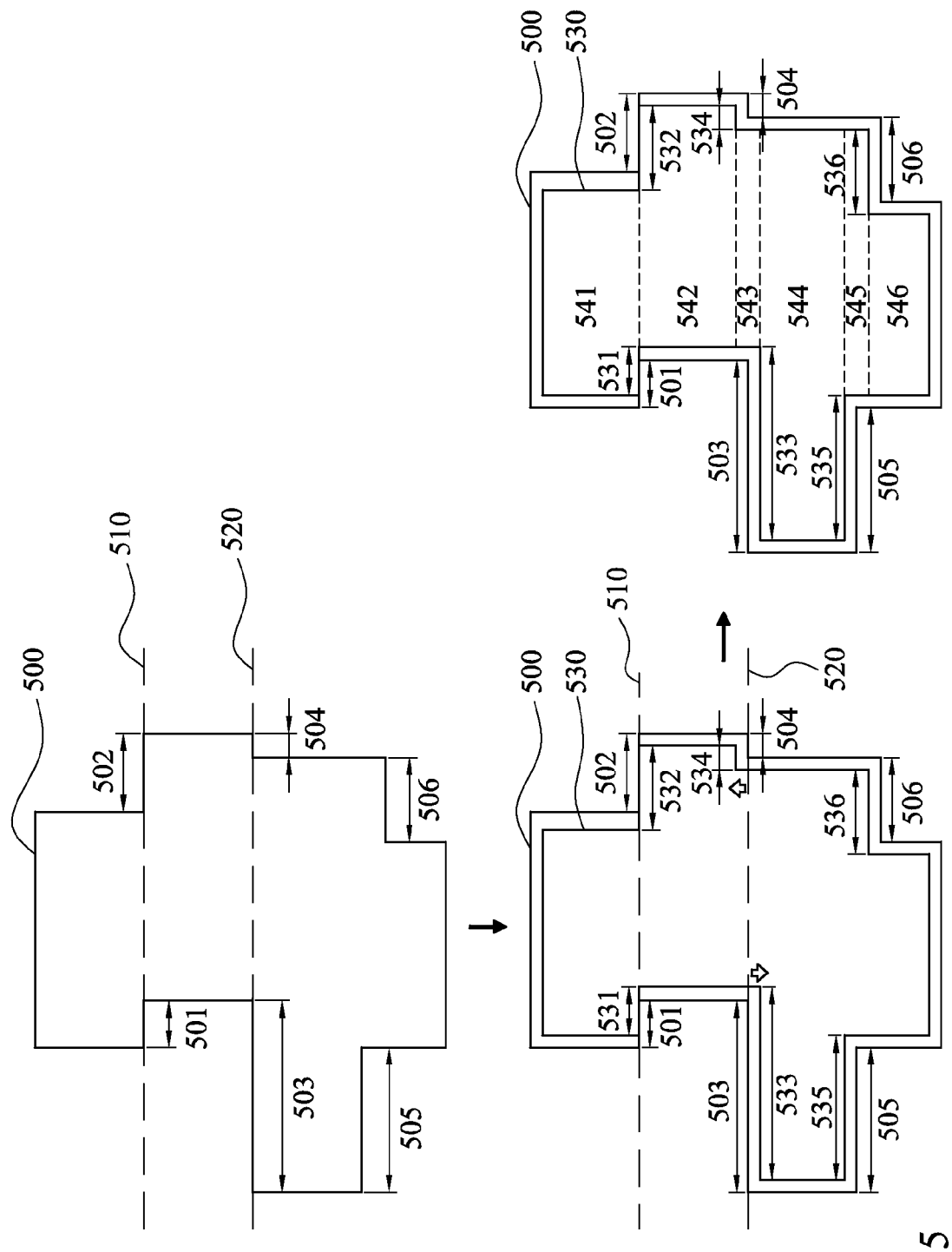
FIG. 5 is a schematic view at various stages of data preparation process, in accordance with various embodiments.

FIG. 5 is a schematic view at various stages of data preparation process. FIG. 5 illustrates a feature 500 having multiple edges and a plurality of jogs 501, 502, 503, 504, 505 and 506. Because the jogs 501 and 502 are on a first line 510, they are picked from the jogs. Similarly, the jogs 503 and 504 are on a second line 520, so they are also picked from the jogs. Since the jogs 505 and 506 are not on the same line, they are not picked because the sliver reduction process is not proper to be applied.

Referring to operation 420, a width ratio of the first jog to the second jog is calculated. In FIG. 5, widths of the jogs 501, 502, 503 and 504 are measured. The width of the jog 502 is divided by the width of the jog 501, and a first width ratio of the jog 502 to the jog 501 is obtained. Similarly, the width of the jog 503 is divided by the width of the jog 504, and a second width ratio of the jog 503 to the jog 504 is obtained.

Continuing to operation 430, a predetermined value is chosen. A designer determines the predetermined value with historical processes, more specifically, the predetermined value is a criterion to judge the impact of the sliver reduction process is acceptable or not. In embodiments, the predetermined value is in a range from about 3 to about 6. In some embodiments, the predetermined value is in a range from about 4 to about 5.

Continuing to operation 440, the width ratio is compared to the predetermined value, and the sliver reduction process is performed if the width ratio being smaller than the predetermined value. As shown in FIG. 5, the feature 500 is resized to form a resized feature 530. Because the first width ratio of the jog 502 to the jog 501 is smaller than the predetermined value, the sliver reduction process is performed so that the resizing process forms resized jogs 531 and 532, which the resized jogs 531 and 532 are still on the first line 510. Fracturing along the resized jogs 531 and 532 will form the main polygons 541 and 542, and there is no sliver polygon between the main polygons 541 and 542.

Further, the second width ratio of the jog 503 to the jog 504 is much greater than the predetermined value, so the sliver reduction process is not performed. In resized feature 530, resized jogs 533 and 534 are no longer on the second line 520. The jog 503 moves downward to form the resized jog 533, and the jog 504 moves upward to form the resized jog 534. When applying the fracturing process, the resized feature 530 is fractured along the resized jog 533 and 534 to form main polygons 542 and 544, and a sliver polygon 543 is formed between the main polygons 542 and 543. If applying the sliver reduction process to the sliver polygon 543, these adjustments will have significant impact on the IC products 140. Thus, the shape of the feature formed on the wafer 132 could not be closely matched the shape of the feature in the IC design layout 112.

Even though a width ratio between the jogs 505 and 506 is much smaller than the predetermined value, the sliver reduction process is not performed because the jogs 505 and 506 are not on the same line. In resized feature 530, resized jogs 535 and 536 are not on the same line. The jog 505 moves upward to form the resized jog 535, and the jog 506 moves upward to form the resized jog 536. When applying the fracturing process, the resized feature 530 is fractured along the resized jog 535 and 536 to form main polygons 544 and 546, and a sliver polygon 545 is formed between the main polygons 544 and 546. If reducing the sliver polygon 560, these adjustments will have significant impact on the IC products 140. Thus, the shape of the feature formed on the wafer 132 could not be closely matched the shape of the feature in the IC design layout 112.

Figure 6:
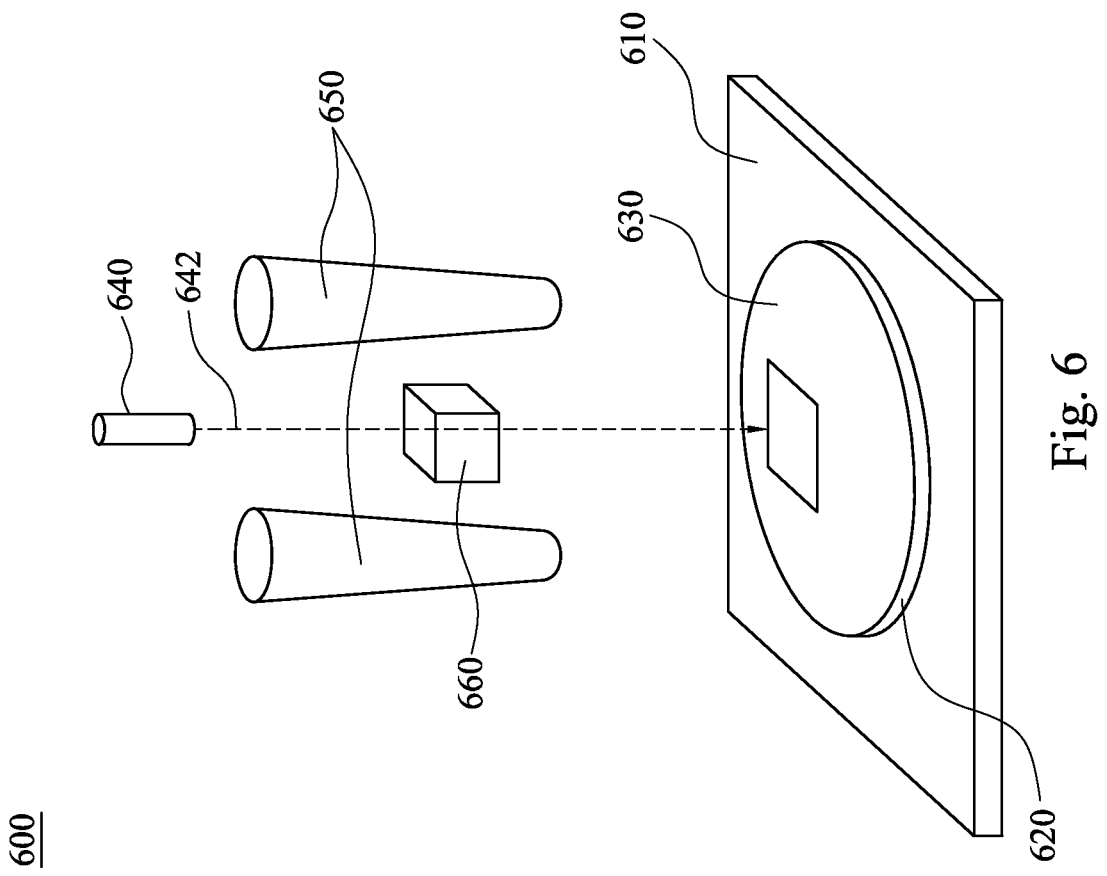
FIG. 6 is a schematic view of a lithography apparatus, in accordance with various embodiments.

FIG. 6 is a schematic view of a lithography apparatus according to various embodiments of the present disclosure. The lithography apparatus 600 is applied at operation 270 of the method 200 in FIG. 2 for e-beam writing, which is on purpose to form the OPC pattern 300 in FIG. 3 on the mask. In embodiments, the lithography apparatus 600 is an energy beam writer that utilizes an electron-based imaging. In some embodiments, the energy beam writer is an e-beam writer.

The lithography apparatus 600 includes a mask stage 610 configured to secure a mask 620, and a resist layer 630 is disposed on the mask 620. An energy source 640 is an electron beam source configured to provide an electron beam 642, which the electron beam 642 writes mask data of the resized OPC feature 330 on the resist layer 630. In embodiments, the resist layer is an energy sensitive resist layer, such as electron-sensitive resist layer, to the energy beam source like the e-beam source.

Referring to FIG. 3 at the same time to further clarify this disclosure. The mask data includes the first main polygon 336 and the second main polygon 338, and a bottom side of the first main polygon 336 is adjoined with a top side of the second main polygon 338. The resized first jog 332 and the resized second jog 334 are disposed between the first main polygon 336 and the second main polygon 338. The resized first jog is larger than the resized second jog in width, and the resized first jog 332 and the resized second jog 334 are on the line 310. The width ratio of the resized first jog 332 to the resized second jog 334 is smaller than the predetermined value. In embodiments, the predetermined value is in a range from about 3 to about 6. In some embodiments, the predetermined value is in a range from about 4 to about 5.

In embodiments, the energy source 640 is an electron gun with a mechanism to generate electrons, such as by thermal electron emission. The electron gun includes a tungsten (or other suitable material) filament designed and biased to thermally emit electrons. In FIG. 6, an electron beam 642 is illustrated as an incident electron beam from the energy source 640 and directed toward the electron-sensitive resist layer 630 to be patterned.

The lithography apparatus 600 also includes one or more lenses 650 to impact the electron beam 642 from the energy source 640 for imaging effect. In embodiments, the lenses 650 include a condenser and further include an objective lens properly configured. Various lenses, such as magnets, are designed to provide force to the electrons for proper imaging effect, such as focusing.

A scanner 660 is configured to deflect the electron beam 642 for scanning a certain region of the mask 620 in a certain mode, such as raster mode. The scanner 660 is operable to direct the electron beam 642 to the mask 620 positioned on a stage 610. In one example, the scanner 660 may include one or more coils to deflect the electron beam 642 in two orthogonal directions such that the electron beam is scanned over a surface area of the mask 620.

The embodiments of the present disclosure discussed above have advantages over existing apparatus and processes, and the advantages are summarized below. Generally, performing the resizing process and the fracturing process to the OPC feature will generate a lot of sliver polygons, which are not friendly for the e-beam writing. The present disclosure provides a method to reduce the silver polygons, and thus the e-beam writing time is decreased. Further, since the sliver polygon is too small to be controlled, reducing the sliver polygons also improves the critical dimension of the mask.

Besides, the present disclosure also provides a mechanism to decide which polygon could be reduced. The sliver reduction process is applied if the width ratio being smaller than the predetermined value, and the shape of the feature formed on the wafer could be closely matched the shape of the feature in the IC design layout. Summarize above points, the sliver reduction process disclosed here will reduce complexity of the manufacturing process and enhances the efficiency.

In accordance with some embodiments, the present disclosure discloses a method of preparing mask data, the method begins with performing a logic operation to a design layout, and an optical proximity correction (OPC) is performed to the design layout to form an OPC feature. The OPC feature has a first jog and a second jog on a line, and the first jog is larger than the second jog in width. The OPC feature is resized to form a resized first jog and a resized second jog on the line if a width ratio of the first jog to the second jog being smaller than a predetermined value.

In accordance with various embodiments, the present disclosure discloses a method of preparing mask data, the method begins with performing a logic operation process to a design layout, and an optical proximity correction (OPC) is performed to the design layout to form an OPC feature having a plurality of jogs. A first jog and a second jog are picked from the jogs along a line, and the first jog is larger than the second jog in width. A sliver reduction process is performed if a width ratio of the first jog to the second jog being smaller than a predetermined value.

In accordance with various embodiments, the present disclosure discloses a lithography apparatus, the apparatus includes a mask stage configured to secure a mask, and a resist layer is disposed on the mask. An energy source is configured to write mask data on the resist layer. The mask data includes a first main polygon and a second main polygon, and a top side of the second main polygon is adjoined with a bottom side of the first main polygon. A resized first jog and a resized second jog are disposed between the first main polygon and the second main polygon, which the resized first jog is larger than the resized second jog in width. The resized first jog and the resized second jog are on a line, and a width ratio of the resized first jog to the resized second jog is smaller than a predetermined value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of preparing mask data, comprising:
    performing a logic operation process to a design layout;
    performing an optical proximity correction (OPC) process to the design layout to form an OPC feature, the OPC feature having a first jog and a second jog on a line, the first jog being larger than the second jog in width, and a width ratio of the first jog to the second jog being smaller than a predetermined value; and
    resizing the OPC feature to form a resized first jog and a resized second jog on the line.

2. The method of claim 1, further comprising fracturing the resized OPC feature along the line to form two main polygons.

3. The method of claim 2, further comprising applying the two main polygons for forming a mask with an e-beam writing process.

4. The method of claim 1, wherein resizing the OPC feature comprises:
    calculating the width ratio of the first jog to the second jog;
    choosing the predetermined value; and
    comparing the width ratio with the predetermined value.

5. The method of claim 4, wherein the main polygons are individually rectangle or square.

6. The method of claim 1, wherein the predetermined value is in a range from about 3 to about 6.

7. The method of claim 6, wherein the predetermined value is in a range from about 4 to about 5.

8. A method of preparing mask data, comprising:
    performing a logic operation process to a design layout;
    performing an optical proximity correction (OPC) process to the design layout to form an OPC feature having a plurality of jogs;
    picking a first jog and a second jog of the jogs along a line, the first jog being larger than the second jog in width, and a width ratio of the first jog to the second jog being smaller than a predetermined value; and
    performing a sliver reduction process.

9. The method of claim 8, further comprising resizing the OPC feature to form a resized first jog and a resized second jog, wherein the resized first jog and the resized second jog are on the line.

10. The method of claim 9, further comprising fracturing the resized OPC feature along the line to form two main polygons.

11. The method of claim 10, further comprising applying the two main polygons for forming a mask with an e-beam writing process.

12. The method of claim 8, wherein the main polygons are individually rectangle or square.

13. The method of claim 8, wherein the predetermined value is in a range from about 3 to about 6.

14. The method of claim 13, wherein the predetermined value is in a range from about 4 to about 5.

15. A lithography apparatus, comprising:
   a mask stage configured to secure a mask, wherein a resist layer is disposed on the mask; and
   an energy source configured to write mask data on the resist layer, wherein the mask data comprises:
   a first main polygon;
   a second main polygon, wherein a top side of the second main polygon is adjoined with a bottom side of the first main polygon; and
   a resized first jog and a resized second jog disposed between the first main polygon and the second main polygon, wherein the resized first jog is larger than the resized second jog in width, the resized first jog and the resized second jog being on a line and a width ratio of the resized first jog to the resized second jog smaller than a predetermined value.

16. The lithography apparatus of claim 15, wherein the energy source is an electron beam source configured to provide an electron beam.

17. The lithography apparatus of claim 16, further comprising:
   a lens configured to impact the electron beam; and
   a scanner configured to deflect the electron beam.

18. The lithography apparatus of claim 16, wherein the electron beam directly writes the mask data on the resist layer of the mask.

19. The lithography apparatus of claim 15, wherein the predetermined value is in a range from about 3 to about 6.

20. The lithography apparatus of claim 19, wherein the predetermined value is in a range from about 4 to about 5.

* * * * *